United States Patent [19]
Knee

[11] Patent Number: 6,037,643
[45] Date of Patent: Mar. 14, 2000

[54] PHOTOCELL LAYOUT FOR HIGH-SPEED OPTICAL NAVIGATION MICROCHIPS

[75] Inventor: Derek L. Knee, Ft. Collins, Colo.

[73] Assignee: Hewlett-Packard Company, Palo Alto, Calif.

[21] Appl. No.: 09/024,093

[22] Filed: Feb. 17, 1998

[51] Int. Cl.[7] .................... H01L 31/0352; H01L 31/00
[52] U.S. Cl. ................... 257/443; 257/72; 257/231; 257/291; 257/446; 257/462
[58] Field of Search .................. 257/72, 231, 232, 257/233, 291, 443, 444, 462, 446

[56] References Cited

U.S. PATENT DOCUMENTS

| | | | |
|---|---|---|---|
| 4,972,244 | 11/1990 | Buffet | 257/446 |
| 4,980,546 | 12/1990 | Berger | 257/462 |

FOREIGN PATENT DOCUMENTS

| | | | |
|---|---|---|---|
| 0576022 | 12/1993 | European Pat. Off. | 257/462 |
| 58-88976 | 5/1983 | Japan | 257/233 |
| 60-182764 | 9/1985 | Japan | 257/446 |
| 62-145867 | 6/1987 | Japan | 257/446 |
| 5-275670 | 10/1993 | Japan | 257/462 |

*Primary Examiner*—Jerome Jackson, Jr.

[57] ABSTRACT

Circuitry is employed to provide an array of photoelements for generating an electrical signal from light energy. The circuit is essentially comprised of a plurality of photoelements including a light-receiving portion, which may include a phototransistor for receiving light and generating electrical energy therefrom, and a non-light-receiving portion, which may include amplification circuitry for properly biasing the phototransistor base and for amplifying the light signal. Within the array, geometric centers of vertically and horizontally adjacent phototransistors are equidistant from one another to form a symmetrical array of photoelements. A relatively high fill factor is achieved by an efficient, symmetrical layout of the photoelements within the array. One main advantage of the high fill factor of the symmetrical array is that it generates a greater light signal than related designs, which eliminates the need for optical magnification of pixels on an original sheet of paper. Additionally, the advantage of the symmetrical array is that the subsequent signal processing of the image captured by the photoreceiving array is not required to correct for unequal distances between geometric centers of adjacent phototransistors.

17 Claims, 4 Drawing Sheets

PHOTOCELL LAYOUT FOR HIGH-SPEED OPTICAL NAVIGATION MICROCHIPS

BACKGROUND OF THE INVENTION

1. Technical Field

The present invention relates generally to photoreceptors designed to operate at low light levels and more particularly to circuits for increasing the reliability of photoreceiver information acquired under conditions in which a signal-to-noise ratio is relatively small.

2. Related Art

An accurate determination of the path of a device across a surface is important in a variety of applications. For example, if a faithful representation of an image of a scanned original is to be acquired, there must be accurate information as to the travel of the scanning device along the original. Typically, the captured image provided by a scanner is a pixel data array that is stored in memory in a digital format. A distortion-free image requires a faithful mapping of the original image to the pixel data array.

U.S. Pat. No. 5,149,980 to Ertel et al., which is assigned to the assignee of the present invention, describes use of a cross-correlation function to determine the relative movement between an original and an array of photoelements in a given direction. The patent notes that the one-dimensional approach can be extended to determine the vector of two-dimensional relative movement between the original and the array, so as to track translation, rotation and scaling in a two-dimensional plane.

The patent to Ertel et al. describes use of an optical sensor array to collect a "signature" of an original. The signature may be provided by illuminating and imaging the surface texture or other optical characteristics of the original. The light intensity will vary on a pixel-by-pixel basis with variations in surface texture. By cross-correlating images of the surface of the original, relative movement between the array and the original can be ascertained.

A critical element of the design of a system such as the one described by Ertel et al. is circuitry to maintain the signal-to-noise ratio of each photoelement sufficiently high to reliably determine the signature of the original. If the signal is the difference in reflectivity from pixel to pixel as a result of slight variations in paper texture of a white paper, the variation in reflectivity may only be approximately six percent. The overall resolution goals translate into a relatively low signal-to-noise ratio for each photoelement, with the desired signal being the small change in reflectivity of the medium of interest and the dominant noise term being shot noise of the photodiode, which is amplified by the phototransister action, as a result of the fixed portion of the reflectivity.

Co-pending U.S. patent application Ser. No. 08/591,848, filed on Jan. 25, 1996, to Baumgartner et al., which is assigned to the assignee of the present invention, also describes the use of circuitry for an optical sensor array to collect a "signature" of an original. Applicants hereby incorporate U.S. patent application Ser. No. 08/591,848 by reference in its entirety. In the preferred embodiment, the sensor array includes a pair of navigation sensors disposed at opposite ends of an imaging sensor for tracking movement of the scanning device relative to the original.

In the reference to Baumgartner et al, each navigation sensor is a two-dimensional array of photoelements that is formed on an integrated circuit substrate that includes readout and signal processing circuitry. The position accuracy necessary over the range of a pixel distance of 40 $\mu$m is 2.0 $\mu$m. The very high positional accuracy requires individual photoelements that are no larger than tens of microns in length in order to acquire sufficiently differing signals from element to element. For a desired pixel size on a paper original of 40 microns, a magnification of 1.5 is achieved by imaging optics comprising microlenses so that photoreceptor elements having a pitch 60 $\mu$m×60 $\mu$m are suitable. Each navigation sensor is comprised of an array having sixty-four columns and thirty-two rows, wherein each row is comprised of sixteen photoelement pairs. Each photoelement pair comprises a single photocell. Each photoelement includes essentially two portions. The first portion includes the phototransistor for receiving light, and the second portion includes a servo amplifier circuitry for biasing the phototransistor base and an integration capacitor for generating a charge from photo-generated current. The integrated charge on the capacitor is periodically read and processed for determining the amount of light falling on the photoelement during a given reading period. An area ratio of to the second portion is commonly referred to the fill factor. Unity as a fill factor for a particular photosensitive microchip ideally represents the most efficient use of microchip space since all light shining on the photoelement would then be converted to photocurrent. The circuit layout of Baumgartner et al achieves a fill factor of approximately 0.40 by utilizing a relatively small number of components in the photoelement.

However, although meritorious to an extent, the photoelement layout of Baumgartner et al. includes several disadvantages. First, the photocell construction of Baumgartner et al is asymmetrical because the adjacent pairs of photoelements represent mirror images of each other. More specifically, the servo amplifier circuitry and integration capacitors for a photoelement pair are oriented adjacent to one another with the phototransistors occupying the remainder of photoelement space. That asymmetrical layout exacerbates image blurring, which occurs when an image on paper moves relative to the photoreceptor array during image acquisition. Additionally, the asymmetrical arrangement is an inefficient use of space on an integrated circuit substrate, which limits the fill factor. The relatively low fill factor requires the use of micro-lenses per pixel to increase the effective fill factor, which increases the cost and complexity a scanning device utilizing the photosensitive array.

What is needed is circuitry which permits reliable use of a photoelement circuitry by providing a photoelement layout which minimizes image blurring during image capture while maximizing the fill factor to achieve navigational chip light use efficiency, which is especially important in low light level applications.

Other objects, features and advantages of the present invention will become apparent upon reading the following specification, when taken in conjunction with the accompanying drawings.

SUMMARY OF THE INVENTION

Circuitry is employed to provide an array of photoelements for generating an electrical signal from light energy. The circuit is essentially comprised of a plurality of photoelements including a light-receiving portion, which may include a phototransistor for receiving light and generating electrical energy therefrom, and a non-light-receiving portion, which may include amplification circuitry for properly biasing the phototransistor base and amplifying the light signal. The non-light receiving portion may include any number of elements, including but not limited to amplification circuitry, light signal integration circuitry and other signal processing circuitry. In the preferred embodiment, the light receiving portion is disposed on an integrated circuit substrate and includes a geometric center. Within the array, geometric centers of vertically and horizontally adjacent phototransistors are equidistant from one another to form a symmetrical array of photoelements.

In the preferred embodiment, the non-light-receiving portion of the photoelement includes an amplifier electrically coupled to at least one phototransistor in the array. Additionally, the non-light-receiving portion is disposed in interstitial spaces between adjacent phototransistors. Although the ordinarily skilled artisan will understand that one servo amplifier may process signals from several adjacent phototransistors, the preferred embodiment includes one servo amplifier for every phototransistor in the array. Furthermore, in the preferred embodiment, each phototransistor and servo amplifier is polygonal in shape. In the preferred embodiment, the servo amplifier polygon has one side that is approximately equal in length to one side of the phototransistor polygon. In the preferred embodiment, each phototransistor polygon is an octagon having two approximately parallel vertical edges which border on vertical edges of horizontally adjacent phototransistor polygons, and two approximately parallel horizontal edges which border on vertically adjacent phototransistor polygons. The remaining edges of the phototransistor polygons create quadrilateral interstitial spaces which receive servo amplifiers having a quadrilateral shape.

In an alternative embodiment, each phototransistor polygon includes a concave portion located on at least one corner thereof, each amplifier is polygonal in shape, and at least a portion of each amplifier polygon is complementarily received into the concave portion. In the alternative embodiment, each phototransistor polygon is a quadrilateral having a concave portion located on at least one corner thereof, each servo amplifier includes a quadrilateral shape, and at least a portion of each servo amplifier polygon is complementarily received into at least one concave portion of at least one phototransistor polygon. More specifically, each phototransistor polygon may resemble a cross shape or a quadrilateral having notched corners. Four adjacent notched corners from four adjacent phototransistor polygons may then create a quadrilaterally-shaped interstitial space for complementarily receiving a quadrilaterally-shaped servo amplifier polygon.

The present invention also relates to method of arranging an array of photoelements within an electrical circuit, wherein each photoelement in the array includes a phototransistor for generating an electrical signal from light energy. More specifically the method includes the step of forming a phototransistor within each photoelement into a polygonal shape having geometric center, wherein geometric centers of vertically and horizontally adjacent phototransistors within said array are equidistant from one another.

The relatively high fill factor is achieved by contributions from a number of factors. One contributing factor is the design of a servo circuit to having a relatively small number of components. Another is the efficient layout of the photoelements within the array. One main advantage of the symmetrical array is that it achieves a fill factor of 0.77–0.83, depending upon the phototransistor and servo amplifier polygonal configurations. That fill factor range creates circuitry which generates a greater light signal than related designs, which eliminates the need for optical magnification of the paper pixels. Additionally, the advantage of the symmetrical array is that the subsequent signal processing of the image captured by the photoreceiving array is not required to correct for unequal distances between geometric centers of adjacent phototransistors.

BRIEF DESCRIPTION OF THE DRAWINGS

The accompanying drawings incorporated in and forming a part of the specification illustrate several aspects of the present invention, and together with the description serve to explain the principles of the invention. The components in the drawings are not necessarily to scale, emphasis instead being placed upon clearly illustrating principles of the present invention. In the drawings appended hereto, like numerals illustrate like parts throughout the several views.

Figure 1:
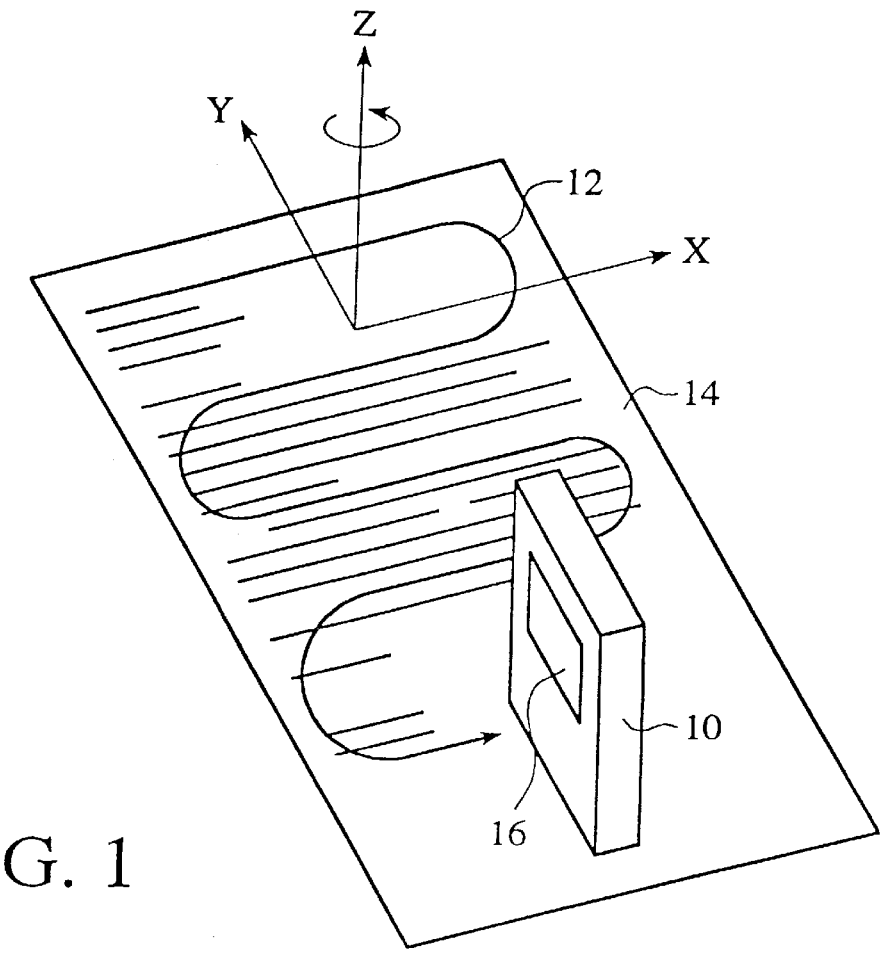
FIG. 1 is a perspective view of a hand-held scanning device following a meandering path on an original.

Reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

DETAILED DESCRIPTION

With reference to FIG. 1, a portable, hand-held scanning device 10 is shown as having followed a meandering path 12 along an original 14. The original may be a piece of paper, but the invention may be used with other image-bearing substrates. In use of the hand-held scanning device, the positions of inherent structural features, such as paper fibers, may be tracked and the resulting positional information may be used to rectify image data. However, the invention may be used in other applications.

The scanning device 10 is preferably self-contained and battery operated. However, the device may include a connection to an external source of power or to data ports of computers or networks. The scanning device includes an image display 16. The display may provide almost immediate viewing of a captured image. The display is not critical.

The scanning device 10 allows three degrees of freedom, with two being in translation and one in rotation. The first degree is the side-to-side movement (X axis movement)

along the original 14. The second degree of freedom is movement upwardly and downwardly along the original (Y axis movement). The third degree of freedom is the ability to operate the device with rotational misalignment of a linear array of image sensor elements relative to the edge of the original 14 (Z axis movement). That is, the linear array of imaging elements may have an angle of attack that is not perpendicular to the direction of device translation.

Figure 2:
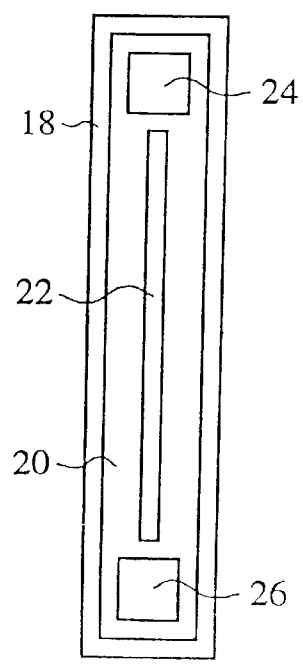
FIG. 2 is a bottom view of imaging and navigation sensors of the scanning device of FIG. 1.

Referring now to FIGS. 1 and 2, the bottom side 18 of the scanning device 10 includes a pivoting member 20 that aids in maintaining proper contact between the original 14 and an imaging sensor 22. Navigation sensors 24 and 26 are located at the opposed ends of the imaging sensor. Because the navigation sensors are mounted on the pivoting member, the navigation sensors are in a fixed location relative to the imaging sensor.

For reasons of physical compactness, the imaging sensor 22 is preferably a contact image device, but for applications in which compactness is less of a concern or a smaller image is desired, sensors employing projection optics may be employed, with magnification less than unity. Contact imaging devices typically employ lenses sold under the trademark SELFOC, which is a federally-registered mark of Nippon Sheet Glass Company Limited. Less conventionally, contact imaging can be obtained using interleaved array elements of sources and proximal sensors, without any imaging lenses. Conventional imaging sensors for scanning applications may be used. The imaging sensor may be part of a unit that also includes an illumination source, illumination optics, and image transfer optics.

In FIG. 1, the meandering path 12 is shown as having four and a fraction swaths, i.e., side-to-side passes across the original 14. A useful imaging sensor 22 for most applications has a length within the range of 25.4 mm and 101.6 mm. The swaths should include regions of overlap, so that a stitching process may be used to produce a faithful representation of the scanned original.

The scanning device 10 includes at least one navigation sensor 24 or 26. In the preferred embodiment, the device includes a pair of navigation sensors, with the sensors being at opposite ends of the imaging sensor 22. While one-dimensional arrays of photoelements that are mounted orthogonally to each other may be used, the much preferred embodiment is one in which each navigation sensor is a two-dimensional array of elements. The navigation sensors 24 and 26 are used to track movement of the scanning device 10 relative to the original.

Each navigation sensor is an array of photoelements that is formed on an integrated circuit substrate that includes readout and signal processing circuitry. The position accuracy necessary over the range of a pixel distance of 40 mm is 2.0 mm. The very high positional accuracy requires individual photoelements that are no larger than tens of microns in length in order to acquire sufficiently differing signals from element to element.

In the operation of the navigation sensors 24 and 26, the desired signal is the difference in reflectivity from pixel to pixel, as caused by variations along the surface of the original 14. Where surface variations are variations in paper texture along a white paper, the reflectivity may vary by only approximately six percent of the basic reflectivity of the white paper. The overall resolution goals would then translate into a signal-to-noise ratio of approximately two for each photoelement. The dominant noise term is the shot noise of the photoelement signal caused by the fixed portion of the reflectivity. The noise signal needs to be less than the six percent paper reflectivity variation if the navigation is going to be determined.

Figure 3:
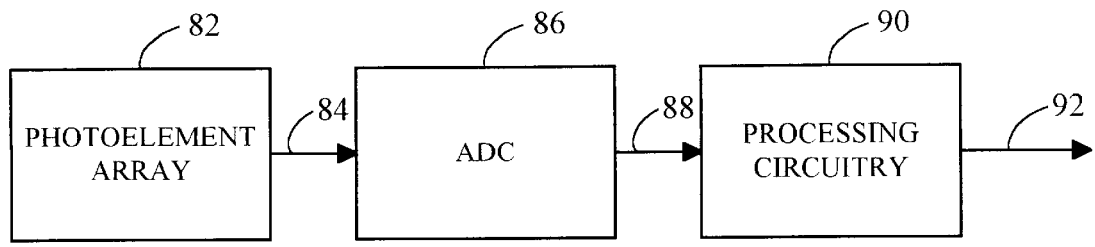
FIG. 3 is a functional block diagram of an array of photoelements and amplifier circuits in accordance with the present invention.

FIG. 3 represents a functional block diagram of an array of photoelements and amplifier circuits in accordance with the present invention. More specifically, block 82 represents a photoelement array which generates a light signal 84 for further processing. Block 86 represents analog to digital (ADC) circuitry which receives the light signal 84 and converts light signal 84 to a digital signal 88. Digital signal 88 is then fed to processing circuitry which is illustrated by block 86. Block 86 essentially represents a massively parallel digital image cross-correlation processor.

Figure 4:
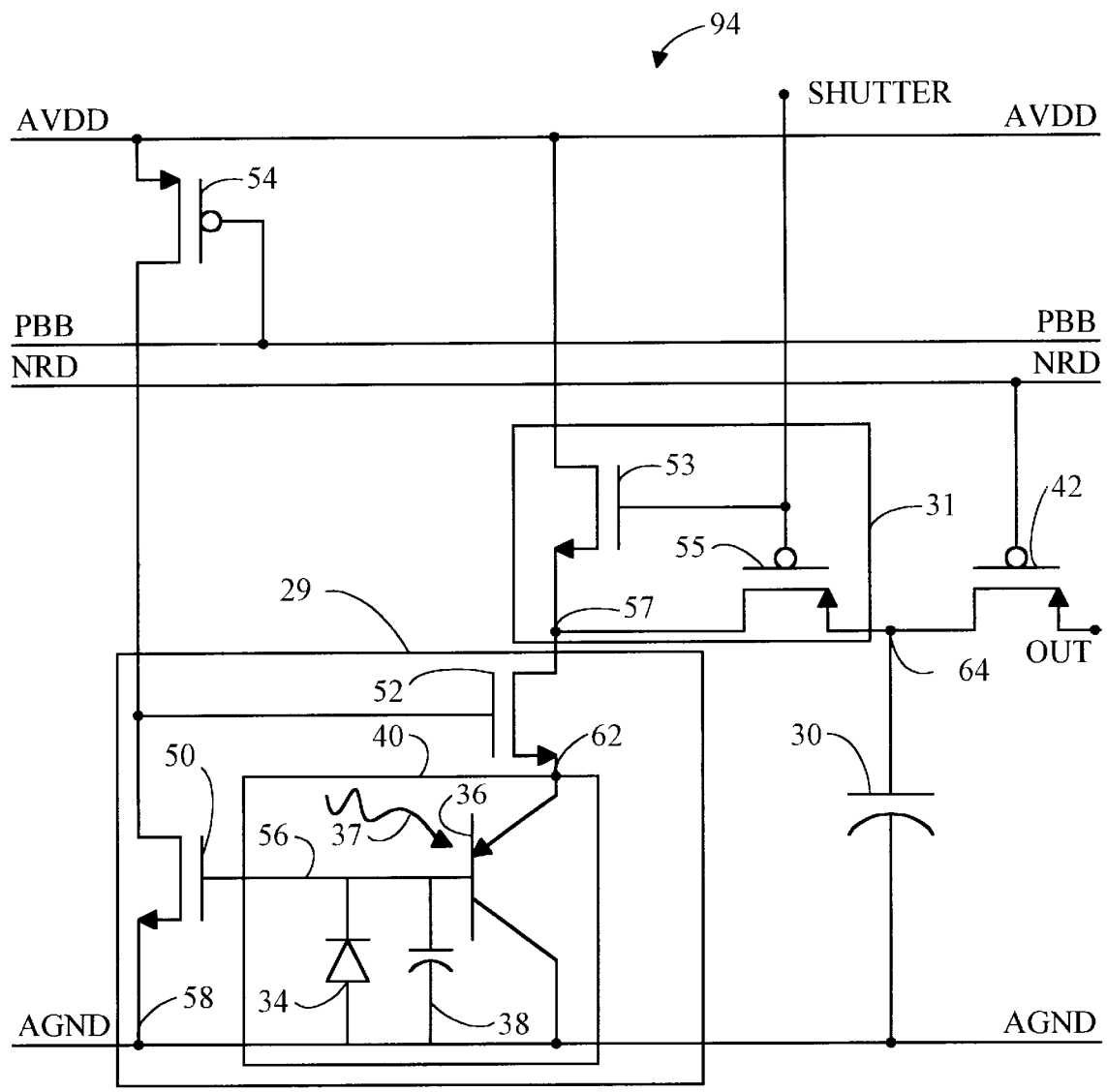
FIG. 4 is a photoelement circuit having a negative feedback loop and shutter mechanism.

FIG. 4 is a schematic diagram of one example of a photoelement circuit which may be incorporated into the integrated circuit substrate of light sensors 24 and 26. For the purposes of the present invention, the ordinarily skilled artisan will understand that any number of circuit configurations may be employed, so long as they fit into the arrayed geometry of the present invention. Incoming light 37 is converted into a current that is integrated during a sample period. The stored value is periodically read out, so that it is available for a next step in a processing sequence. At the start of an integration cycle, photocurrent that is generated by means of a photodiode 34 is amplified by a PNP transistor 36. The photodiode and the transistor, along with a parasitic capacitance 38, define a phototransistor 40. The amplified photocurrent charges the integration capacitor 30 downwardly toward a level of about 1.75 volts.

The photodiode 34 of the phototransistor 40 generates a current in response to reception of light photons. The photodiode is connected to the base of the PNP transistor 36. The reverse bias diode capacitance 38 is a parasitic capacitance that may be 0.16 pF. In this embodiment, the optical power on the photodiode was determined to be about 1.1 nW. This causes a current of approximately 0.6 nA in the diode current source. Because of the low current level, amplification is needed to ensure that the optical variation signal, which is only approximately six percent of the constant photocurrent, will create sufficient voltage differences to be distinguished from noise.

The PNP transistor 36 of the phototransistor 40 amplifies the photocurrent. The amplification provided by the transistor 36 allows use of an integration capacitor 30 that facilitates reproducibility from photoelement to photoelement. In the absence of amplification, the low current from the photodiode 34 would require a very small capacitor as an integrator in order to get a 1 volt swing, e.g. 10 pF. Because of the parasitics, this would be difficult to reproduce on an element-to-element basis. Changing the photoelement layout from a diode to a substrate PNP device is a convenient way of providing current amplification. A beta value of eighteen increases the output emitter current to 11.4 nA. Thus, an integration capacitor of 0.20 pF can be used. This facilitates reproducibility, but is not so large as to require excessive area.

A servo circuit 29 is formed by MOS transistors 50 and 52. The MOS transistors form a bias point amplifier with a common gate stage for the output of the transistor 36. MOS transistor 54 supplies the bias current via analog power supply line AVDD when the proper signal is received from bias voltage line PBB. To achieve proper transfer of the current generated in the phototransistor 40 to the integration capacitor 30, the photodiode reverse voltage (i.e., the transistor base voltage) must be kept at a substantially constant level. If the voltage at the base node 56 were to be allowed to shift, the photocurrent would be at least partially consumed in charging and discharging the diode capacitance 38, rather than providing current to be amplified by the substrate PNP transistor 36.

The transistor base voltage at the node 56 is kept at a substantially fixed level by the three MOS transistors 50, 52 and 54. While not critical to achieving the desired operation, in the embodiment of FIG. 3, the substantially fixed voltage level is approximately equal to the NMOS threshold level above AVDD at the collector node 58. The MOS transistors operate as a negative feedback loop by means of transistor 52 operating as a source follower to the emitter node 62 of the PNP transistor 36. Thus, the base voltage is controlled by the emitter voltage of the transistor. This is possible because the base voltage, i.e. the photodiode output, has a very high DC impedance level. The bias technique of emitter control operated effectively during testing. From the output perspective, transistor 52 is a common gate stage that has an added advantage of providing additional isolation of the emitter node 62 and the base node 56 of the transistor from the voltage swing of a node 64.

The electronic shutter 31 is formed from NMOS transistor 53 and PMOS transistor 55. When a signal from input node SHUTTER is at a logic low, transistor 55 is in a conducting mode and transistor 53 is in a non-conducting mode. In this state, the servo circuit continues to charge the integration capacitor 30. In this mode, electronic shutter circuit 31 is in an "open" mode. When a high logic signal is received from node SHUTTER, then transistor 53 is in a conducting mode and transistor 55 is in a non-conducting mode. In this state the photo-generated emitter current from phototransistor 40 is diverted from the integration capacitor 30 to the power supply line AVDD. In this mode, electronic shutter circuit 31 is in a closed mode and integration capacitor 31 is not integrating any photo-generated charge. Thus, to end an integration period, electronic shutter circuit configured into a "closed" mode. During the closed mode integration capacitor 30 holds its charge until it is read.

At the end of a read period, a read switch 42 is turned "on" via a logic signal from line NRD to output the stored value in integration capacitor 30 to a transfer amplifier (not shown) via node OUT. The read switch may be a PMOS transistor that is controlled by a read control line NRD. In this manner, integration capacitor 30 holds its charge until it is read after the shutter circuit is in a closed mode until it is read via read transistor 42. The operation of the transfer amplifier (not shown) pulls the node 64 down to 1.75 volts. This accomplishes the transfer of the signal to transfer amplifier circuitry (not shown). At the conclusion of the transfer process, the read control line NRD is caused to return to a logic low and transistor 42 returns to a non-conducting state.

Figure 5:
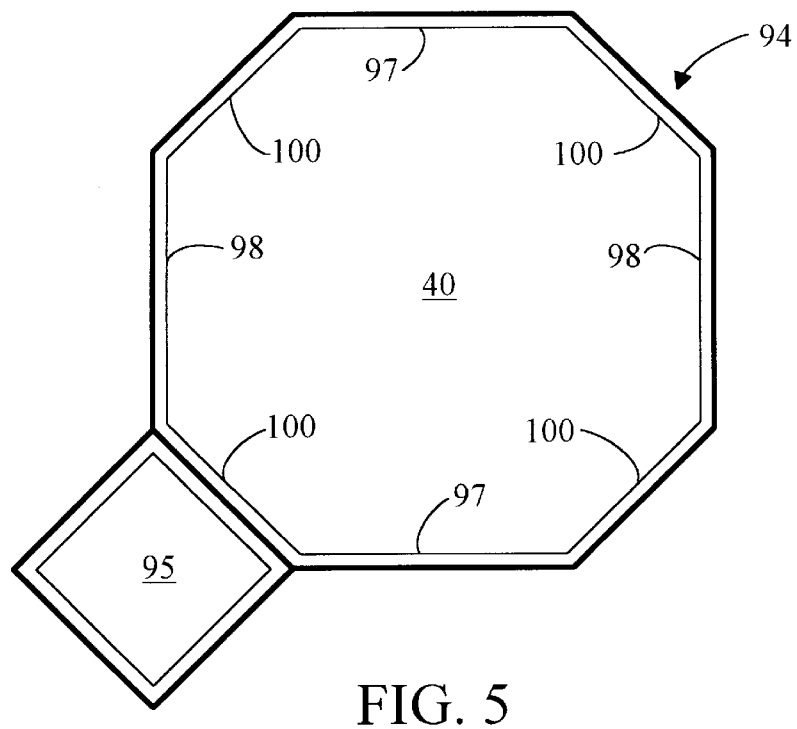
FIG. 5 is a schematic diagram of the planar geometry of an individual photoelement layout in accordance with the invention.

FIG. 5 illustrates a schematic diagram of the planar geometry of the geometrical layout individual photoelement 94, which is configured in accordance with the present invention. In this particular embodiment, photoelement 94 includes a phototransistor 40, which is adapted to generate a signal from light energy, as described above. The phototransistor 40 is polygonal in shape, has two substantially parallel vertical sides 98, has two substantially parallel horizontal sides 97, and has four diagonal sides 100.

The photoelement 94 also includes processing circuitry within polygon 95, which is essentially in the shape of a quadrilateral having one side which is substantially equal to a diagonal side 100 located in the lower left hand corner of the phototransistor 40. The ordinarily skilled artisan will also understand that the lengths of diagonal sides 100 need not be equal to the lengths of horizontal and vertical sides 97 and 98. Indeed, in order to maximize a fill factor, which is a ratio of the phototransistor area 40 to the total area of the photoelement 94, the sides 100 should be as short as possible so as to minimize the area of the polygon 95, which includes the processing circuitry. The ordinarily skilled artisan will understand that the polygon 95 may include the circuitry illustrated in FIG. 4, or other equivalent circuitry which adequately processes an electrical signal generated from a photoelement. In the preferred embodiment, the lengths of vertical sides 98 are approximately 24 µm, the lengths of horizontal sides 97 are approximately 24 µm, and the length of diagonal sides 100 are approximately 23.5 µm. The overall width of the photoelement is approximately 60 µm. The height of element 40 is equal to its width. The ordinarily skilled artisan will understand that those dimensions are not critical to the invention.

Figure 6:
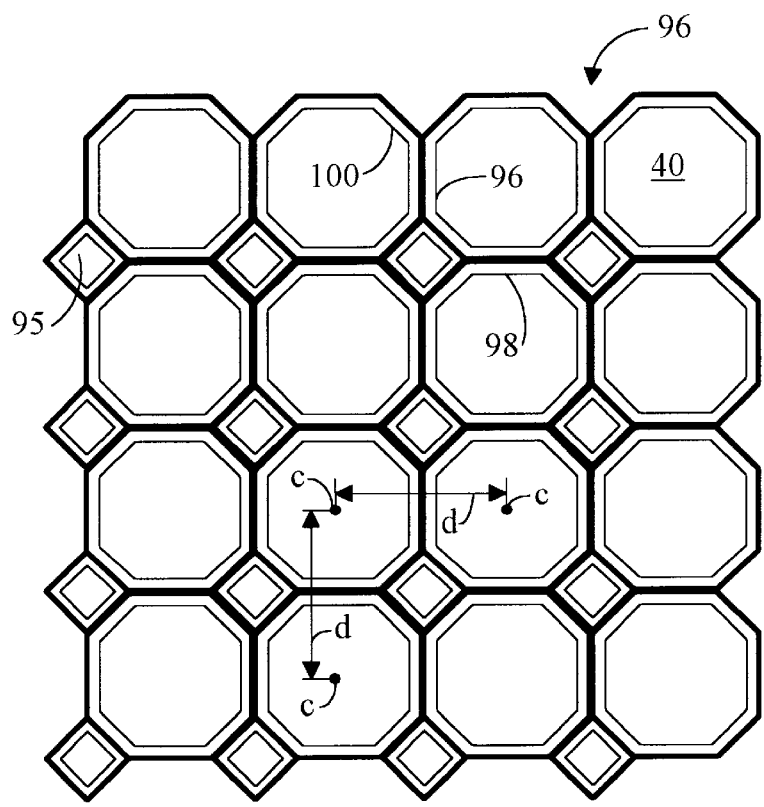
FIG. 6 is a schematic diagram of the planar geometry of a layout of an array of photoelements in accordance with the present invention.

FIG. 6 illustrates a 4×4 array 96 of photoelements 94. The ordinarily skilled artisan will understand that an array 96 of photoelements 94 may comprise any number of photoelements. As is seen from FIG. 6, each of the polygons 95, which include servo circuitry, are disposed within interstitial spaces between each one of the phototransitors 40. FIG. 6 also illustrates that the distance (d) between geometric centers (c) between vertically and horizontally adjacent phototransistors 40 is equal.

Figure 7:
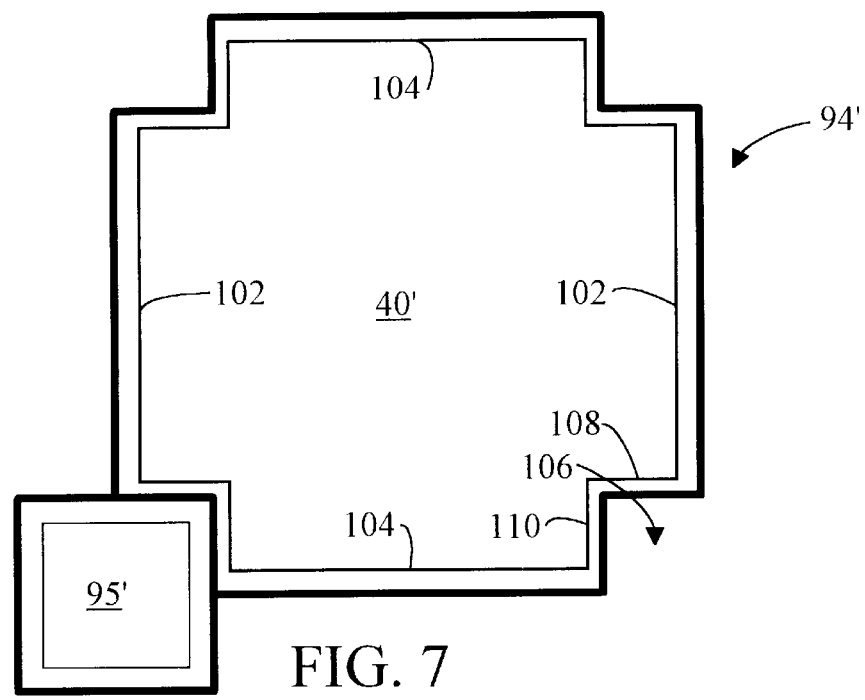
FIG. 7 is a schematic diagram of the planar geometry of an alternative embodiment of an individual photoelement and layout in accordance with the invention.
Figure 8:
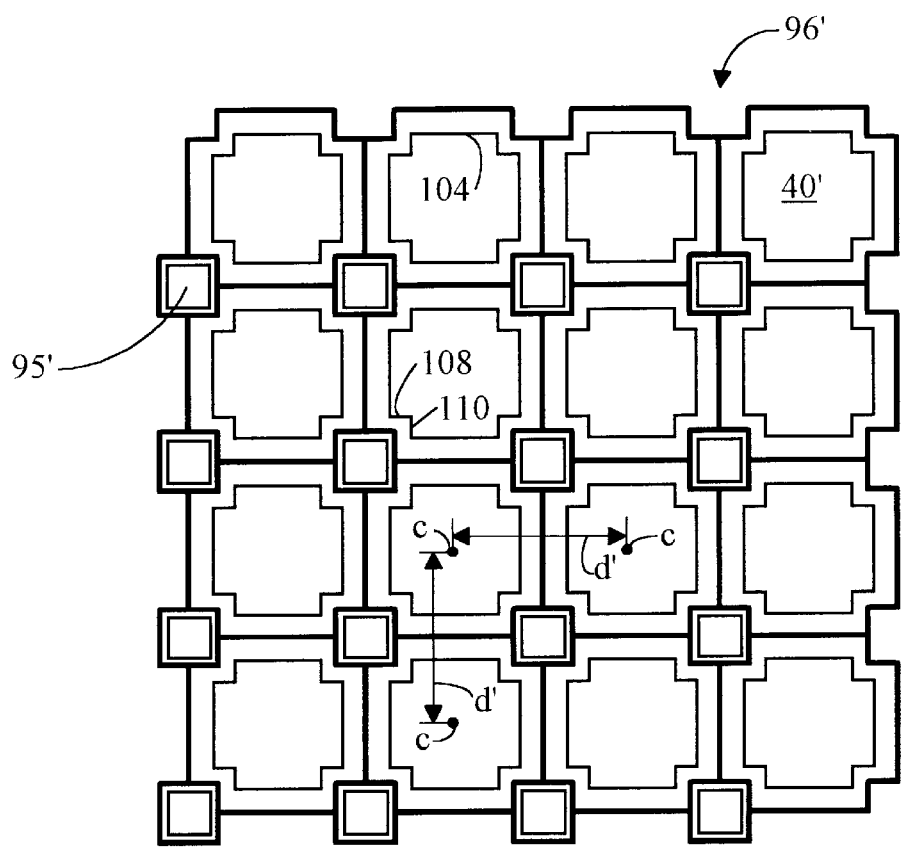
FIG. 8 is a schematic diagram of the planar geometry of an alternative embodiment of a layout of an array of photoelements in accordance with the present invention.

FIG. 7 illustrates yet another embodiment of a photoelement 94'. The photoelement 94' also consists of a phototransitor 40' and processing circuitry within polygon 95'. In a preferred embodiment, polygon 95' is a square. The phototransitor 40' is essentially comprised of a quadrilateral having concave corners 106. The corners 106 define horizontal and vertical walls 108 and 110, respectively, at the ends of vertical and horizontal sides 102 and 104, respectively, so that the photoelement resembles a cross. In this embodiment, the circuitry within polygon 95' partially fits into the notched corner 106. In the preferred embodiments, the lengths of vertical and horizontal sides 102 and 104 are approximately 33.8 µm, the lengths of sides 108 and 110 are approximately 10.9 µm, and the lengths of the sides of polygon 95 are approximately 22.5 µm. FIG. 8 illustrates a 4×4 array 96' of photoelements 94'. As can be seen from the FIG. 8, geometric centers (c) are vertically and horizontally adjacent phototransistors 40' are equal distance from one another, as noted by the distance (d).

The fill factor for the array illustrated in FIG. 6 is 0.77, while the fill factor in the array of FIG. 8 is 0.83. These relatively high fill factors, as compared to related circuits, represent an extremely efficient array layout. Because the fill factors are so high, the arrays illustrated in FIG. 6 and FIG. 8 generate a much greater light signal than related designs having the same total area, which eliminates the need for optical magnification of paper pixels. Furthermore, an advantage of the symmetrical distribution of phototransitors 40 and 40' is that subsequent signal processing of the image captured by each array is not required to correct for unequal distances between geometric centers of adjacent phototransitors.

The foregoing description has been presented for purposes of illustration and description. It is not intended to be exhaustive or to limit the invention to the precise forms disclosed. Obvious modifications or variations are possible in light of the above teachings. For example, the phototransistor may be comprised of essentially any shape, so long as geometric centers are vertically and horizontally adjacent and phototransitors are of equal distance. Additionally, each phototransitor need not have its own associated amplification circuitry. For example, one servo amplification polygon may handle four surrounding phototransitors. The embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

Now, therefore, the following is claimed:

1. An electrical circuit, comprising:

an array of photoelements for generating an electrical signal from light energy, wherein each photoelement includes a phototransistor having a geometric center, and wherein geometric centers of vertically and horizontally adjacent phototransistors within said array are equidistant from one another; and an amplifier electrically coupled to at least one phototransistor in the array, wherein said amplifier processes electrical signals from said at least one phototransistor, and wherein said amplifier is disposed in an interstitial space between adjacent phototransistors.

2. The electrical circuit of claim 1 wherein each said photoelement includes one phototransistor and one amplifier.

3. The electrical circuit of photoelements of claim 1 further including a fill factor of at least 0.4.

4. The electrical circuit of claim 1, wherein said phototransistor has a surface that is polygonal in shape and said interstitial spaces are polygonal in shape, and wherein each said interstitial space polygon has one side that is approximately equal in length to one side of said phototransistor surface polygon.

5. The electrical circuit of claim 1 wherein each said phototransistor has a surface that is polygonal in shape and said interstitial spaces are polygonal in shape, and wherein each said interstitial space polygon has one side that is greater in length than one side of said phototransistor surface polygon.

6. The electrical circuit of claim 1 wherein:

each said phototransistor has a surface that is shaped as an octagon; and each said interstitial space is shaped as a quadrilateral.

7. The electrical circuit of claim 1 wherein:

each said phototransistor includes a concave portion located on at least one corner of said phototransistor.

8. The electrical circuit of claim 1 wherein:

each said phototransistor has a surface that is substantially quadrilateral in shape, said phototransistor surface having a concave portion located on at least one corner thereof; and each said interstitial space is quadrilateral in shape.

9. An array of photoelements for generating an electrical signal from light energy, wherein each photoelement includes a light-receiving portion having a geometric center, and wherein geometric centers of vertically and horizontally adjacent light-receiving portions within said array are equidistant from one another, said array further comprising:

at least one non-light receiving portion in the array, said at least one non-light receiving portion disposed in an interstitial space between light-receiving portions, wherein each said light-receiving polygon forms an octagon shape, and wherein each said non-light receiving polygon forms a quadrilateral shape.

10. An array of photoelements for generating an electrical signal from light energy, wherein each photoelement includes a light-receiving portion having a geometric center, and wherein geometric centers of vertically and horizontally adjacent light-receiving portions within said array are equidistant from one another, an amplifier electrically coupled to at least one of said light-receiving portions, wherein said amplifier processes electrical signals from said one light-receiving portion, and wherein said amplifier is disposed in an interstitial space between adjacent light-receiving portions.

11. The array of claim 10 wherein each said photoelement includes one light-receiving portion and one non-light-receiving portion.

12. The array of photoelements of claim 10 further including a fill factor of at least 0.4.

13. The array of claim 10 wherein each said light receiving portion and said non-light receiving portion is polygonal in shape, and wherein each said non-light receiving polygon has one side that is approximately equal in length to one side of said light-receiving polygon.

14. The array of claim 10 wherein each said light receiving portion and said non-light receiving portion are polygonal in shape, and wherein each said non-light receiving polygon has one side that is greater in length than one side of said light-receiving polygon.

15. The array of claim 10 wherein:

each said light-receiving portion includes a concave portion located on at least one corner of said light-receiving portion; and each said non-light receiving portion is polygonal in shape, and at least a portion of each said non-light receiving polygon is complementarily received into said concave portion.

16. The array of claim 10 wherein:

each said light-receiving portion is substantially quadrilateral in shape, said light-receiving polygon having a concave portion located at least one corner thereof; and each said non-light receiving portion includes a quadrilateral shape, and at least a portion of each said non-light receiving portion is complementarily received into at least one concave portion of at least one light receiving potion.

17. A method of arranging an array of photoelements within an electrical circuit, wherein each said photoelement in said array includes a phototransistor for generating an electrical signal from light energy, said method including the steps of:

forming a phototransistor within each photoelement, said phototransistor having a geometric center, wherein geometric centers of vertically and horizontally adjacent phototransistors within said array are equidistant from one another;

disposing amplifiers in interstitial spaces between adjacent phototransistors; and electrically coupling each of said amplifiers to respective one of said phototransistors.

* * * * *